United States Patent [19]

Schaake et al.

[11] Patent Number: 4,960,728
[45] Date of Patent: Oct. 2, 1990

[54] HOMOGENIZATION ANNEAL OF II-VI COMPOUNDS

[75] Inventors: Herbert F. Schaake, Denton; Roland J. Koestner, Richardson, both of Tex.

[73] Assignee: Texas Instruments Incorporated, Dallas, Tex.

[21] Appl. No.: 257,141

[22] Filed: Oct. 11, 1988

Related U.S. Application Data

[63] Continuation of Ser. No. 104,122, Oct. 5, 1987, abandoned.

[51] Int. Cl.⁵ .................. H01L 21/324; H01L 21/263
[52] U.S. Cl. .............................. 437/82; 148/DIG. 3; 148/DIG. 15; 148/DIG. 64; 148/DIG. 97; 437/105; 437/726; 437/760; 437/987
[58] Field of Search ................ 148/DIG. 3, 7, 18, 15, 148/22, 35, 39, 60, 64, 72, 97, 110, 127, 145, 160, 167, 157, 153, 169; 156/610–614; 427/248.1, 255, 255.2; 437/5, 7, 81, 82, 105, 107, 110, 111, 126, 127, 146, 141, 159, 160, 165, 168, 987

[56] References Cited

U.S. PATENT DOCUMENTS

| | | | |
|---|---|---|---|
| 3,954,518 | 5/1976 | Schmidt et al. | 437/3 |
| 3,979,232 | 9/1976 | Hager et al. | 437/3 |
| 4,028,145 | 6/1977 | Kasenga | 437/3 |
| 4,318,217 | 3/1982 | Jenner et al. | 437/5 |
| 4,376,663 | 3/1983 | Wang et al. | 437/5 |
| 4,418,096 | 11/1983 | Gauthier | 427/76 |
| 4,481,044 | 11/1984 | Schaake et al. | 437/247 |
| 4,507,160 | 3/1985 | Beck et al. | 437/247 |
| 4,549,195 | 10/1985 | Bluzer | 357/30 |
| 4,568,397 | 2/1986 | Hoke et al. | 437/81 |
| 4,642,142 | 2/1987 | Horman | 437/120 |
| 4,655,848 | 4/1987 | Kay et al. | 437/102 |

OTHER PUBLICATIONS

Faurie et al., *Thin Solid Films*, vol. 90 (1982), pp. 107–112.
Faurie et al., *Appl. Phys. Lett.*, vol. 41 (3), (1982), pp. 264–266.
Faurie et al., *J. Vac. Sci. Tech.*, A 3 (1), Jan./Feb. 1985, pp. 55–59.
Schaake et al., *J. Vac. Sci. Tech.*, A 3 (1), Jan./Feb. 1985, pp. 143–150.
Yao, *Technology and Physics of MBE* (E. Parker, Ed.), Plenum Press, N.Y., c. 1985, pp. 313–342.
Yao, "MBE at II-VI Compounds" from *The Technology and Physics of MBE*, E. Parker, Ed. (Plenum-N.Y.), pp. 335–339.

*Primary Examiner*—Olik Chaudhuri
*Assistant Examiner*—William Bunch
*Attorney, Agent, or Firm*—Melvin Sharp; James T. Comfort; Ferdinand M. Romano

[57] ABSTRACT

Films of $Hg_{1-x}Cd_xTe$ grown at low temperatures by MBE or MOCVD are homogenized by annealing at about 350° C. for 1.25 to 3 hours.

20 Claims, 1 Drawing Sheet

HOMOGENIZATION ANNEAL OF II-VI COMPOUNDS

This application is a continuation, of application Ser. No. 07/104,122, filed Oct. 5, 1987 abandoned.

BACKGROUND OF THE INVENTION

1. Field of the Invention.

The present invention relates to semiconductor materials, and, more particularly, to growth of II-VI compound semiconductors materials.

2. Description of the Related Art.

Alloys of mercury telluride and cadmium telluride, generically denoted $Hg_{1-x}Cd_xTe$, are extensively employed as photosensitive semiconductors for infrared radiation. Indeed, $Hg_{0.8}Cd_{0.2}Te$ has a bandgap of about 0.1 eV which corresponds to a photon wavelength of 12 $\mu$m and $Hg_{0.73}Cd_{0.27}Te$ a bandgap of about 0.24 eV corresponding to a photon wavelength of 5 $\mu$m; and these two wavelengths are in the two atmospheric windows of greatest interest for infrared detectors. In particular, extrinsic p-type $Hg_{1-x}Cd_xTe$ has potential application in infrared focal plane arrays operating in the 10-12 $\mu$m wavelength window.

The $Hg_{1-x}Cd_xTe$ is either formed as a bulk crystal or grown on a substrate such as CdTe by liquid phase epitaxy or other methods in order to have a more convenient substrate. Such epitaxial $Hg_{1-x}Cd_xTe$ films typically have a thickness in the order of ten $\mu$m.

Molecular beam epitaxial (MBE) films of $Hg_{1-x}Cd_xTe$ alloys are currently grown with a substrate temperature of approximately 200° C., onto a substrate which, before the growth of the $Hg_{1-x}Cd_xTe$ film, presents a surface of CdTe. The crystal orientation of the CdTe is either (111)B or (100). Currently, the orientation preferred is the (100), which eliminates twinning which is present in the (111)B orientation. See, J. Arias et al, 5 J. Vac. Sci. Tech. A 3133 (1987). Other orientations are also used. The carrier concentration of the material is set in one of two ways. In the first, the growth conditions, that is, the substrate temperature and beam fluxes, are adjusted to give the desired carrier concentration, with the material being used in the as-grown conditions (n type is grown at about 190° C. and p type at about 210° C.). In the other method, which has only recently been reported, after growth the material is given an anneal in mercury saturated conditions to annihilate the acceptor states which arise from metal vacancies in the as-grown material and convert p type to n type. This anneal is performed at a low temperature, but less than 300° C., for above this temperature, there is a large concentration of metal vacancies which are stable. Indeed, annealing at over 300° C. will convert as-grown n type material to p type.

However, this growth procedure has the problem of producing material with anomolous electrical properties.

SUMMARY OF THE INVENTION

The present invention provides a homogenization anneal for MBE or MOCVD grown $Hg_{1-x}Cd_xTe$ to eliminate lateral variations in x due to the growth. This solves the problem of anomolous electrical properties in the known growth procedures that are caused by these lateral variations.

BRIEF DESCRIPTION OF THE DRAWINGS

The drawings are schematic for clarity.

DESCRIPTION OF THE PREFERRED EMBODIMENTS

Figure 1:
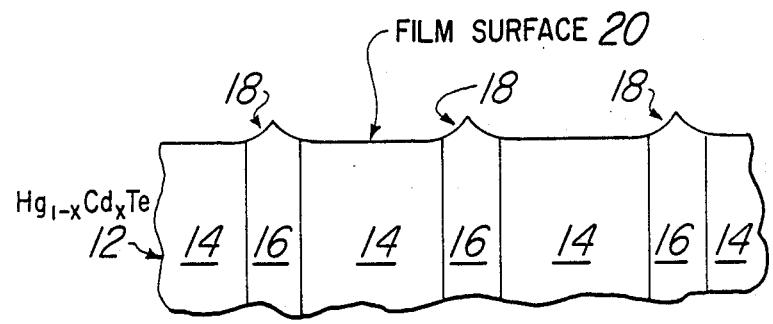
FIG. 1 illustrates in cross sectional view $Hg_{1-x}Cd_xTe$ grown at low temperature.

A problem with the known MBE and MOCVD growth methods of $Hg_{1-x}Cd_xTe$ on CdTe, which has not been recognized by those practiced in the art, is that surface faceting during the growth of an MBE film leads to local variations in the alloy ratio, i.e., the x value in the $Hg_{1-x}Cd_xTe$. For example, an MBE film growing in a (100) direction will develop surface roughness such that the surface tends to become (111)A planes. This faceting does not fully develop, however, meaning that the actual surface has different surface normals depending on position on the surface. The $Hg_{1-x}Cd_xTe$ alloy growing beneath these different surface normals has differing x values, depending on the local surface normal; see FIG. 1 which is a cross sectional view of a $Hg_{1-x}Cd_xTe$ film 12 grown on a CdTe substrate (not shown). Film 12 has regions 14 of high x value $Hg_{1-x}Cd_xTe$ and regions 16 of low x value $Hg_{1-x}Cd_xTe$ with regions 16 growing beneath facets 18 on surface 20 and adjacent regions 16 separated laterally by about 1,000 Å to 3,000 Å by regions 14. Regions 16 are a few hundred Å thick. The magnitude of the x variation is estimated to be as much as 0.1; that is, x may be equal to 0.2 in a region 16 and equal to 0.3 in a region 14.

Thus, in the current art, material as grown does not have a uniform x-value laterally. This leads to many of the current undersirable electrical properties which these materials exhibit. Furthermore, as the tendency to facet is recognized to be a result of crystal growth, MOCVD films of $Hg_{1-x}Cd_xTe$ grown at low substrate temperatures where interdiffusion is not large (substrate temperature less than 300° C.) will also exhibit such nonuniformities in x-value.

To alleviate this problem, the preferred embodiment methods subject the MBE material to a low temperature anneal suitable to homogenize the x-value variations by lateral interdiffusion. This anneal can be performed either in-situ or after removal from the growth chamber. The amount of annealing necessary can be estimated from the formula:

$$t = d^2/D$$

where the time t is given in seconds, d is the mean spacing between regions of comparable x-value (3,000 Å), and D is the interdiffusion coefficient for the alloy being grown, which may be obtained from Tang and Stevenson, 50 Appl. Phys. Lett. 1272 (1987). Necessary times at various temperatures are shown in Table I for an alloy of x=0.2. It will be noted that annealing at temperatures 300° C. and lower will result in extraordinarily long annealing times. This explains why the low temperature anneal in the current art, which is generally only for a few hours, will not homogenize the grown alloy. Temperatures of 450° C. and higher are also undesirable, for in addition to homogenization of the alloy, interdiffusion occurs between the substrate and the alloy film, and between a capping layer, if present, and the alloy film. Thus an anneal between 300° and 450° C. for a suitable time (5 minutes to 25 hours) is necessary to homogenize the film. A post anneal at a lower temperature, and under mercury saturated conditions will generally be needed to adjust the carrier concentration by generally practiced current art.

The homogenization anneal may be done in in-situ in the growth chamber, or in some other place. The mercury ambient may correspond to any point within the phase existence region at the temperature of the anneal, or with a suitable cap, such as deposited CdTe, vacuum conditions may be used.

TABLE I

| Temperature (°C.) | D(cm²/sec) | Time |
|---|---|---|
| 300 | 1E-14 | 25 hours |
| 350 | 2E-13 | 1.25 hours |
| 400 | 1E-12 | 0.25 hours |
| 450 | 5R-12 | 3 minutes |

A first preferred embodiment method of annealing an MBE-grown film of $Hg_{1-x}Cd_xTe$ on a CdTe substrate has the following steps:

(a) After completion of $Hg_{1-x}Cd_xTe$ film 12 growth, a 3,000 Å thick film of CdTe 22 is immediately grown without withdrawal of the sample from the MBE growth chamber. The mercury pressure which was present during growth of $Hg_{1-x}Cd_xTe$ film 12 is maintained during the early stages of growth of CdTe film 22 (to approximately 1,000 Å thickness) to protect $Hg_{1-x}Cd_xTe$ film 12 from decomposition.

Figure 2:
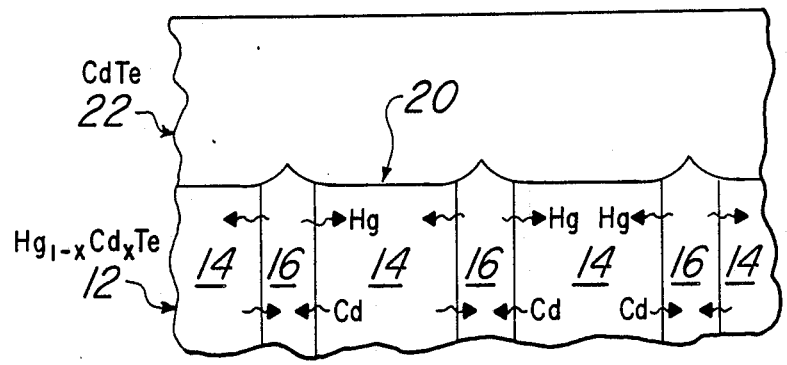
FIG. 2 is the same view as FIG. 1 but during application of the first preferred embodiment method.
Figure 3:
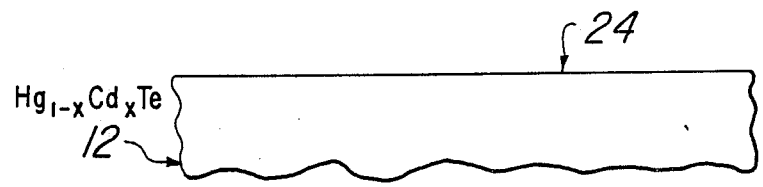
FIG. 3 is the same view as FIG. 1 but after application of the first preferred embodiment method.

(b) The sample is then moved to another chamber within the MBE apparatus, where it is annealed at 350° C. for 3 hours. The annealing results in diffusion of mercury from regions 16 to regions 14 and cadmium from regions 14 to regions 16 as illustrated by the wavy arrows in FIG. 2. This homogenizes film 12 with respect to x. The sample is then removed from the MBE apparatus and capping CdTe film 22 together with the portion of film 12 at surface 20 that has been interdiffused with capping film 22 (about 5,000 Å) are removed. The resultant surface 24 of film 12 is relatively planar because the anneal has effectively diffused away facets 18.

The 3 hour anneal at 350° C. is more than the approximate minimum 1.25 hours listed in Table I; this excess annealing is to insure homogenization even if regions 16 are farther apart than expected or if the interdiffusion coefficient is not accurate. However, the excess annealing also increases the interdiffusion of film 12 with the CdTe substrate and with capping film 22. Thus if a 2 μm interdiffusion from the CdTe substrate were taken as an upper limit, the anneal should be limited to no more than 56 hours; but this would totally interdiffuse away capping CdTe film 22 and lead to decomposition of film 12. Increasing the thickness of capping CdTe film 22 is not practical due to misfit dislocations that propagate from it into film 12; 3,000 Å is about an upper limit for the thickness of capping CdTe film 22 and thus limits the homogenization anneal at 350° C. to about 11 hours.

A second preferred embodiment method of annealing an MBE-grown film of $Hg_{1-x}Cd_xTe$ on a CdTe substrate follows step (a) of the first preferred embodiment and then steps (b') and (c):

(b') The sample is then moved to another chamber within the MBE apparatus, where it is annealed at 350° C. for 1.25 hours. It is then removed from the MBE apparatus and capping CdTe film 22 plus the surface interdiffused portion of film 12 are removed.

(c) The sample is annealed in a saturated mercury atmosphere at 200° C. for 24 hours; this yields an n type $Hg_{1-x}Cd_xTe$ film 12.

MODIFICATIONS AND ADVANTAGES

Various modifications of the preferred embodiment methods may be made while retaining the features of a homogenization anneal. For example, the film growth may be by metalorganic chemical vapor deposition (MOCVD) or metalorganic MBE (MOMBE); the substrate may be CdZnTe, MnZnTe, or similar II-VI compounds; the film may be $Hg_{1-x}Zn_xTe$, $Hg_{1-x-y}Zn_yCd_xTe$ or similar II-VI compounds; the capping material may be $Hg_{1-y}Cd_yTe$ with y>x or similar II-VI material; and the homogenization anneal may be in a mercury atmosphere without a capping film of CdTe or other similar material. The homogenization anneal may be used for doped or undoped films.

The invention provides the advantage of lessened anomolous carrier concentrations and mobilities through a lateral homogenization anneal.

What is claimed is:

1. A homogenization anneal process for group II-VI compound semiconductor films, comprising the steps of:
   (a) providing a substrate of a first group II-VI semiconductor material;
   (b) providing a film of a second group II-VI semiconductor material on said substrate at a temperature below about 300 degrees C.; and
   (c) annealing said substrate with said film thereon at a temperature in the range of from about 300 to about 450 degrees C. for a time to provide lateral homogenization of said film but limited interdiffusion of said film and substrate.

2. The method of claim 1, wherein:
   (a) said second group II-VI semiconductor material is $Hg_{1-x}Cd_xTe$.

3. The method of claim 2, further including:
   (a) providing a cap on said film of a third group II-VI material,
   (b) said annealing being at about 350 degrees C. and for about one to three hours.

4. The method of claim 3, wherein:
   (a) said cap is $Hg_{1-y}Cd_yTe$ with $1 \geq y > x$ and of thickness less than about 3,000 Å.

5. The method of claim 1, further comprising the step of:
   (a) after step (c), annealing said substrate with film in a mercury ambient at a second low temperature to render said film n type.

6. A method of reducing nonuniform carrier concentrations and mobilities in a group II-VI semiconductor compound, comprising the steps of:
   (a) providing a surface of a first material comprising a first semiconductor compound;
   (b) growing under low temperature conditions less than about 300 degrees C. a second crystalline film comprising said group II-VI compound on said surface; and
   (c) annealing said film at a temperature from about 300 degrees C. to about 450 degrees C. for a sufficient time to reduce nonuniform carrier concentrations and mobilities in directions along an interface between said first film and said second material.

7. The method of claim 6 wherein the temperature of said first material is less than 300 C. when said second film is grown.

8. The method of claim 6 wherein said second film is grown by molecular beam epitaxy.

9. The method of claim 8 wherein the temperature of said first material is approximately 200 C. when said second film is grown.

10. The method of claim 9 wherein said first material is at a temperature which results in growth of a p-type conductivity first film.

11. The method of claim 10 wherein the temperature of said first material is approximately 210 C. when said second film is grown.

12. The method of claim 9 wherein the temperature of said first material is approximately 190 C. when said second film is grown.

13. The method of claim 6 wherein said second film is grown by MOCVD.

14. The method of claim 6 wherein said II-VI compound is $Hg_{1-x}CdTe$.

15. The method of claim 6 wherein the anneal of step (b) is performed for a time duration, t, which is consistent with the relation $t = d^2/D$, wherein d is the mean spacing between regions of comparable carrier concentrations and mobilities, and D is the interdiffussion coefficient for said first film.

16. The method of claim 15 wherein d is approximately 3000 Angstroms.

17. The method of claim 6 wherein the anneal of step (b) is performed for time and temperature conditions consistent with data presented in Table I of the Specification.

18. The method of claim 6 further comprising the step of performing an anneal to convert said first film to an opposite conductivity type.

19. The method of claim 10 further comprising the step of performing an anneal to convert said first film to n-type conductivity material.

20. A homogenization anneal for group II-VI semiconductor compound films, comprising the steps of:
 (a) providing a growth plane of a first group II-VI semiconductor material;
 (b) growing a film of group II-VI semiconductor material of desired conductivity type by molecular beam epitaxy on said growth plane; and
 (c) annealing the film at a temperature of 350° C. for at least 1.25 hours to reduce nonuniform carrier concentrations within the film in directions along the resulting interface between the film and the growth plane.

* * * * *